United States Patent
Murata et al.

(10) Patent No.: US 7,012,263 B2
(45) Date of Patent: Mar. 14, 2006

(54) ION SOURCE APPARATUS AND ELECTRONIC ENERGY OPTIMIZED METHOD THEREFOR

(75) Inventors: Hirohiko Murata, Toyo (JP); Masateru Sato, Toyo (JP)

(73) Assignee: Sumitomo Eaton Nova Corporation, Tokyo (JP)

( * ) Notice: Subject to any disclaimer, the term of this patent is extended or adjusted under 35 U.S.C. 154(b) by 0 days.

(21) Appl. No.: 10/866,511

(22) Filed: Jun. 11, 2004

(65) Prior Publication Data
US 2004/0251424 A1 Dec. 16, 2004

(30) Foreign Application Priority Data
Jun. 13, 2003 (JP) .............................. 2003-169316

(51) Int. Cl.
*H01J 27/00* (2006.01)
(52) U.S. Cl. ............. 250/423 R; 422/186; 422/186.05; 204/298.06; 204/298.16; 204/298.31
(58) Field of Classification Search ............ 250/423 R; 422/186, 186.05; 204/298.06, 298.16, 298.31
See application file for complete search history.

(56) References Cited

U.S. PATENT DOCUMENTS

| | | | | |
|---|---|---|---|---|
| 5,122,251 A | * | 6/1992 | Campbell et al. | ...... 204/298.06 |
| 6,803,585 B1 | * | 10/2004 | Glukhoy | ............ 250/423 R |
| 2003/0091482 A1 | * | 5/2003 | Weiler et al. | ............ 422/186 |

FOREIGN PATENT DOCUMENTS

| | | |
|---|---|---|
| JP | 08-209341 | 8/1996 |
| JP | 2000-048734 | 2/2000 |

* cited by examiner

*Primary Examiner*—Nikita Wells
*Assistant Examiner*—Zia R. Hashmi
(74) *Attorney, Agent, or Firm*—Watts Hoffmann Co, LPA

(57) ABSTRACT

The ion source apparatus of the present invention includes at least one pair of antenna-opposed magnets sandwiching an antenna element and moveable to magnetic element and the antenna element both in horizontal and vertical directions in a plasma chamber, and a control means performing a positional adjustment over the antenna-opposed magnets to the antenna element in the plasma chamber. An electrons-generated region of high-concentration is formed around the antenna element through electric fields based on outputs of the antenna element and magnetic fields of the antenna-opposed magnets crossing the antenna element.

11 Claims, 8 Drawing Sheets

ION SOURCE APPARATUS AND ELECTRONIC ENERGY OPTIMIZED METHOD THEREFOR

BACKGROUND OF THE INVENTION

1. Field of the Invention

The present invention relates to an ion source apparatus used in an ion implanter, particularly, an electronic energy optimized method improving a generating rate of given ions by lowering undesired hydrogen ions, and an ion source apparatus using the method.

2. Related Art

In industries, ion implanting technologies have been generally used for implanting impurities to workpieces such as silicon wafers, glass substrates, etc. when mass-producing products such as integrated circuits, flat panel displays, etc.. Conventional ion implanters have been provided with an ion source, which enables to ionize desired dopant elements and accelerate the elements to form ion beams having normal energy.

The ion source includes one rectangular plasma chamber made of graphite, stainless, aluminum, etc. and an extraction electrode system extracting ions confined in the plasma chamber. The rectangular plasma chamber is constituted of a top wall, 4 side walls and a bottom wall. The plurality of permanent magnets forming a cusped magnetic field for confining plasma are provided at the top wall and the 4 side walls. And, a gas supply opening for the ion source gas and an antenna introduction opening are provided at the top wall while plasma electrodes having opened outlets for extracting ion beams are provided at the bottom wall. The extraction electrode system works to extract the ion beams through electric fields of plasma, and the system is usually formed of the plurality of electrodes such as a plasma electrode, an extraction electrode, a suppression electrode and a ground electrode The ion source of this kind will extract ions by affecting plasma with electric fields after the ion source gas is made into plasma in the plasma chamber. The ion source gas filled in the plasma chamber is hydrogen compound gas where basic elements of ions combine with hydrogen. For example, $PH_3$ is used for obtaining phosphorus ions while $B_2H_6$ is used for obtaining boronic ions. In actual cases, under consideration of easy handling, safety, etc., the hydrogen compound gas is not solely used as the ion source gas, but the ion source gas is diluted with hydrogen gas. Specifically, diborane gas diluted with hydrogen ($B_2H_6/H_2$), phosphine gas diluted with hydrogen ($PH_3/H_2$) or arsine gas diluted with hydrogen ($AsH_3/H_2$) are used as the ion source gas.

As described, the ion source gas is the hydrogen compound gas mixed with hydrogen gas. Thus, mixed plasma, that is, plasma based on many kinds of ions, is produced in the plasma chamber. In general, plasma includes not only ions suitable for ion implantation onto workpieces but also ions not suitable therefor. Moreover, plasma includes ions of by-products produced through ionization. Furthermore, Plasma includes electrons having an energy distribution. For example, when using the diborane gas diluted with hydrogen ($B_2H_6/H_2$), $B_2H_x^+$ ions (X=1, 2, 3, 4, 5 and 6) or $BH_y^+$ ions (y=1, 2 and 3), etc. are produced in addition to $B^+$, $B_2^+$ ions as boron (B)-related ions. Or, $H^+$ ions or $H_2^+$, $H_3^+$ ions, etc. are produced as hydrogen (H)-related ions. In its ratio, the hydrogen-related ions will be 85% to 15% of the boron-related ions. When using the phosphine gas diluted with hydrogen ($PH_3/H_2$) as the ion source gas, the hydrogen-related ions will be 70% to 30% of phosphorus (P)-related ions.

Accordingly, dopant gases such as diborane gas, etc. are diluted with hydrogen gas in the plasma chamber, and high-energy electrons activated in the plasma chamber are generated. Through this ionized processes, hydrogen ions in addition to desired ions ($B^+$ or $P^+$) are produced so as to form ion beams extracting through the opened outlets.

Thus, the hydrogen-related ions are implanted with the desired ions. When the hydrogen-related ions have excess current density, the ions cause undesirable heat increase over the workpieces thereby damaging a silicon wafer or photoresist on a surface of a glass substrate.

In order to decrease number of undesired ions not contributing to the ion beam extraction, the following method is generally known that magnets are provided in the plasma chamber so as to split off ionized plasma. The magnets confine undesired ions and high-energy electrons in a place far from the opened outlets of the plasma chamber whereas they confine desired ions and low-energy electrons in a place nearby the opened outlets of the plasma chamber.

Considering ion doping, etc., there will not have any notable problems if $B_2H_x^+$ ions or $BH_y^+$ ions extracted from the plasma chamber are included. But, $H_x^+$ ions (X=1, 2 and 3) are not allowed to be included. Those undesired ions cause heat load by colliding with each walls of the plasma chamber, the extraction electrodes or workpieces subject to the ion doping. In addition, accelerated current will be uselessly consumed. Thus, for maintaining high-quality ion sources, it is necessary not to make $H_x^+$ ions included in ion beams.

Accordingly, a magnetic filter is provided in the plasma chamber, specifically, the magnetic filter is provided between a bottom portion of the plasma chamber and the extraction electrodes to be parallel therewith. In this structure, heavy ions advancing toward the extraction electrodes pass through the magnetic filter while light ions are obstructed thereby to pass through. See Japanese patent Application Laid-Open No. Hei 8-209341, pars. 0003-0006 and 0021-0023.

In the ion source apparatus disclosed in the above reference, among ions entered into slits of the magnetic filter, only the light ions such as $H^+$ ions and $H_2^+$ ions having small mass are forced to be largely curved by means of magnetic fields formed in the slits orthogonal to advancing directions of those ions. Then, the ions enter into Larmor radius and are trapped by the magnetic fields. Through the above, the light ions on the side of the plasma electrodes will be diffused and disappeared.

On the other hand, the heavy ions such as $B^+$, $B_2^+$ ions, $B_2H_x^+$ ions, $BH_y^+$ ions, $P^+$ ions or $PH_x^+$ ions (x=1, 2 and 3) having large mass pass through the slits with little influence in their advancing direction, whereby the ions disperse toward the plasma electrodes. However, the above method will largely and solely depend on performance of the magnetic filter. In addition, the magnetic filter negatively affects production of ions; it works to decrease numbers of the ions. Furthermore, in case various ion source materials accrete to and collect over the magnetic filter, the performance of the filter will be significantly impeded.

Further, Japanese patent Application Laid-Open No. 2000-48734, pars. 0015-0018 shows another method enabling to suppress components ratio of hydrogen ions in ion beams extracted from high-frequency ion sources.

In general, in case cusped magnetic fields formed between high-frequency electrodes and plasma are excessive, it makes possible for high-energy electrons to perform drift motion. And, through the high-energy electrons, hydrogen in high ionization energy is electrolytically dissociated so as to be ionized thus increasing components ratio of hydrogen ions in the ion beams. On the other hand, too weak cusped magnetic fields will inhibit electrons from the drift motion, which makes life of electrons short giving more difficulties to maintain high-frequency discharges.

Therefore, by setting the strength of cusped magnetic fields in sheath formed between plasma in the plasma chamber and the high-frequency electrodes to 1–3 mT, the cusped magnetic fields in the sheath will be controlled. With this structure, the drift motion of the high-energy electrons can be controlled, and the maintenance of the high-frequency discharges in short-life electrons with least drift motion in the sheath can be eased. Accordingly, not only ion beams can be stably extracted, but also the components ratio of hydrogen ions in ion beams can be well repressed.

However, in the above method, because the drift motion of the high-energy electrons needs to be repressed, it makes difficult to produce desired ions from plasma so as to output high-powered ion beams.

Furthermore, a burnous-typed ion source as shown in FIG. 7A can be also used as a standard ion source. Considering the burnous-typed ion source, a pair of magnets 33 is provided so as to face each other and outside an arc chamber 32 provided with plasma electrodes 31 thus generating magnetic fields. Thermoelectrons 36 are discharged from filaments 34 in the arc chamber 32 through cathode caps 35. These thermoelectrons 36 react to boron or phosphorus of ion source gas and generate ions. When a source of electric fields is affected by permanent magnets arranged at interior walls of a plasma chamber, the thermoelectrons 36 are trapped in the electric fields in such a manner as to spirally withdraw along magnetic flux of the external magnets 33 as shown in FIG. 7B. A direction of motion e in the trapped electrons will be determined based on the direction when the thermoelectrons 36 are emitted from the filaments 34. That is, the direction will be equal or inversive to the one of the magnetic flux. This phenomenon is based on cyclotron motion as shown in FIG. 7C, and electrons and ions move along the magnetic flux in such a manner as to revolve about the magnetic flux.

On the other hand, when an RF antenna is arranged in the plasma chamber, desired voltages are applied through high-frequency (or microwave) power. For example, in case a high-frequency electric field of 13.56 MHz is applied to the antenna, an electric field is generated in a direction as shown in FIG. 7D, and also a magnetic field is generated in a direction orthogonal to the direction of the electric field. Thus, electrolytic dissociation will be advanced through collision between electrons accelerated by the electric field and gas molecules thereby producing plasma. However, only through operation of the electric field by the antenna, the drift of electrons is limited. And also, regardless of the generation of the magnetic field, this magnetic field does only have limited influence on the electrons.

SUMMARY OF THE INVENTION

In view of the forgoing situations, it is an object of the present invention to provide an electronic energy optimized method and an ion source apparatus using the method. Specifically, in the present invention, an antenna and magnets are arranged in a plasma chamber without being provided with any magnetic filters so as to improve a generation rate of heavy ions by lowering numbers of undesired hydrogen ions. The present invention also contributes to efficiency of high-frequency ion sources.

In order to achieve the above object, the present invention has the following structures as recited in claims. An ion source apparatus of the present invention includes a plasma chamber having a supply port of ion source gases, an antenna element for generating plasma in the plasma chamber through a high-frequency voltage supplied from high-frequency power, the plurality of magnetic elements peripherally arranged on wall surfaces of the plasma chamber which form cusped magnetic fields confining plasma, and an extraction electrode system composed of the plurality of electrodes for extracting ion beams from plasma.

In specific features, the present invention includes: at least one pair of antenna-opposed magnets sandwiching the antenna element and also relatively moveable in both horizontal and vertical directions to the magnetic element and the antenna element; and control means to perform a positional adjustment over the antenna-opposed magnets to the antenna element in the plasma chamber so as to form a high-concentrated area to generate electrons around the antenna element.

Accordingly, electrons remaining in the plasma chamber or generating from the antenna element are affected by electrical fields generating through an electric current flowing in antenna coils. And, by the magnetic fields generated by the antenna-opposed magnets and also by the magnetic fields generated between the antenna-opposed magnets and the magnetic elements close to the antenna-opposed magnets, an electron-trapped area, that is, the high-concentrated area generating electrons is formed around the antenna element. In the electron-trapped area, because of considerable numbers of electrons, large numbers of ions based on components of ion source gases are dissociated thus enabling to extract high-powered ion beams from the extraction electrode system. Further, light ions such as hydrogen ions, etc. are trapped through magnetic actions of the magnetic fields generated by the antenna-opposed magnets and also the magnetic fields generated between the antenna-opposed magnets and the magnetic elements close to the antenna-opposed magnets.

Furthermore, the ion source apparatus of the present invention is provided with the antenna-opposed magnets close to the antenna element in the plasma chamber, and a relative position of the antenna-opposed magnets to the antenna element is adjusted. In addition to the above, the present invention includes a step forming the high-concentrated area generating electrons which traps electrons around the antenna element due to electric fields based on outputs of the antenna element and magnetic fields of the antenna-opposed magnet crossing the antenna element. Accordingly, electronic energy in the plasma chamber is optimized so as to increase a generation rate of desired ions.

Still further, by ionizing ion source gases through electrons produced in the electrons-generated area, and also by forming two types of magnetic actions based on magnetic fields generated through the antenna-opposed magnet and also based on magnetic fields generated through the magnetic element provided on the walls in the plasma chamber and the antenna-opposed magnet, light ions such as undesired hydrogen ions, etc. are trapped so as to produce ion beams composed of only target ions.

DESCRIPTION OF THE PREFERRED EMBODIMENTS

Figure 1:
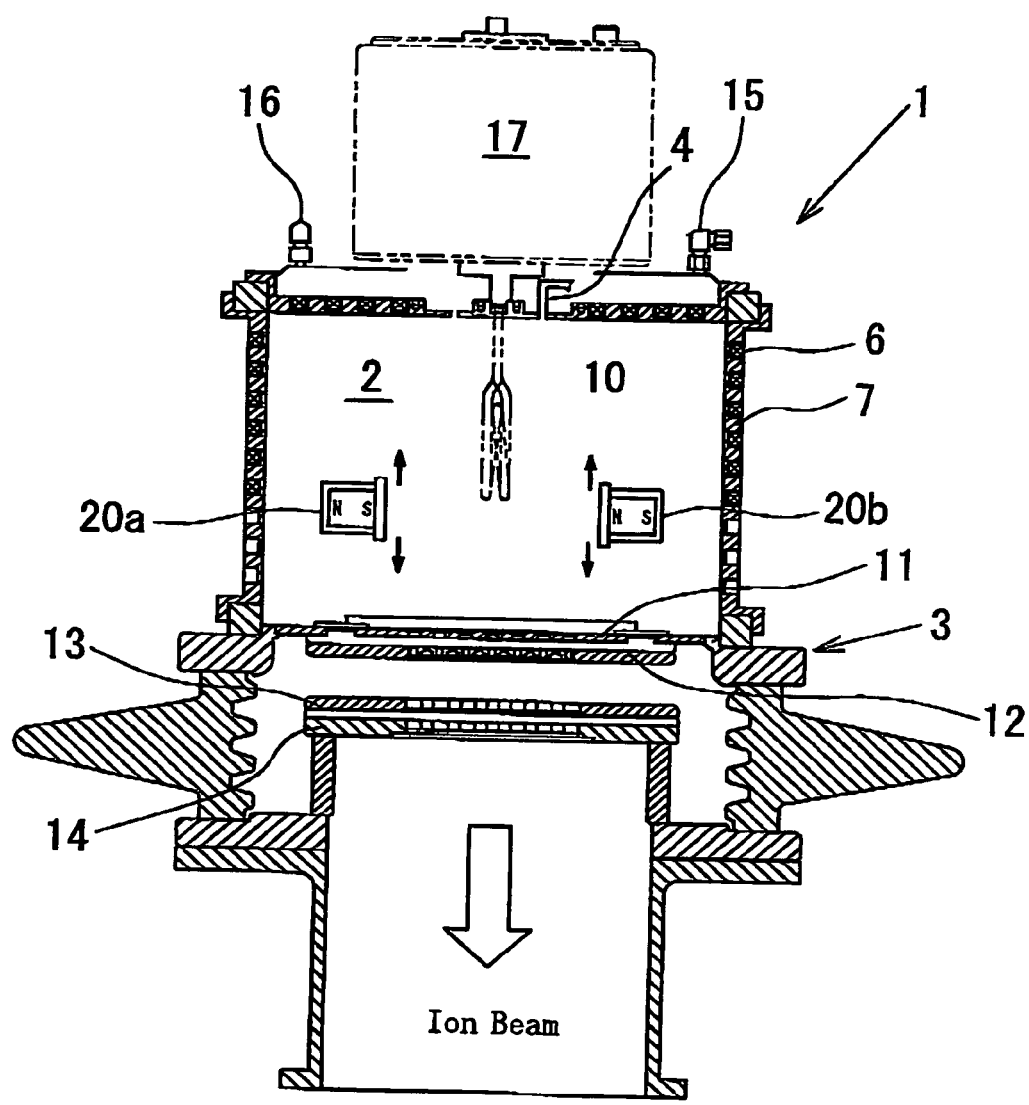
FIG. 1 is a block schematic diagram of sectional view showing an ion source apparatus according to the present invention.

Embodiments of the present invention will be described with reference to accompanying drawings. FIG. 1 is a block schematic diagram of sectional view showing a high-frequency ion source apparatus according to the present invention. The ion source apparatus 1 generating plasma through high-frequency discharge includes a plasma chamber 2 for confining plasma, and an extraction electrode system 3 for extracting ion beams from plasma in the plasma chamber 2 through electric fields.

Figure 2:
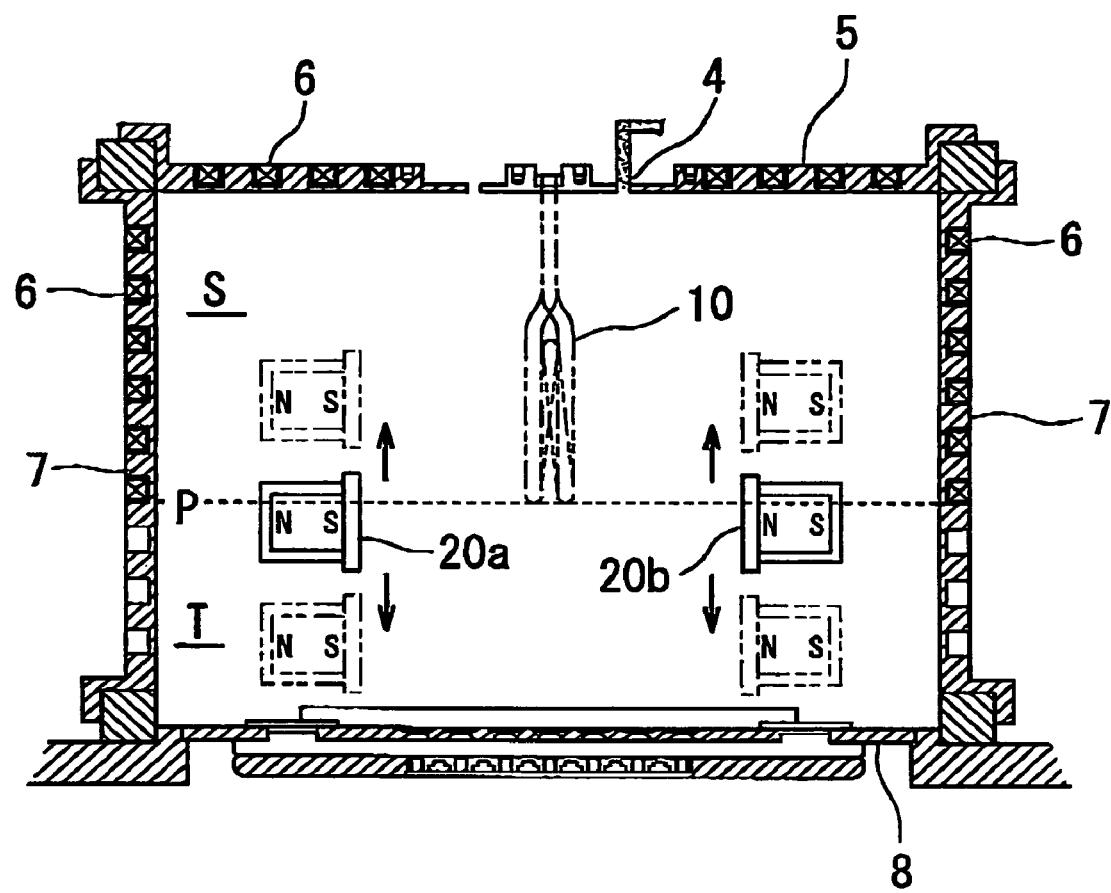
FIG. 2 is a schematic diagram of sectional view showing antenna-opposed magnets displaced to an antenna element arranged in a plasma chamber of the ion source apparatus according to the present invention.

As shown in FIG. 2, the rectangular plasma chamber 2 is composed of a top wall 5 having an opened inlet 4 to supply ion source gases, four side walls 7 integrally formed with the top wall 5 and provided with permanent magnets 6 at outer periphery thereof, and a bottom wall 8 having an opened outlet. The permanent magnets 6 are arranged in such a manner that either N pole or S pole thereof faces to the walls of the plasma chamber 2. Thus, magnetic fluxes run from the N pole to the S pole between contiguous magnets thereby forming a cusped magnetic field concentrating plasma into the center of plasma chamber 2. See also FIG. 3.

Ion source gas supplied into the plasma chamber 2 is ionizable dopant gas directly or indirectly obtainable from a source of compressed gas, and given amount of the dopant gas is ejected into the plasma chamber 2. Typical ion source element which may be boron (B), phosphorus (P) or arsenic (As) is supplied in gaseous form such as diborane, phosphine, arsine, etc.. In addition, a vacuum pumping apparatus (not shown) is connected as a means to vacuate the plasma chamber.

Figure 4:
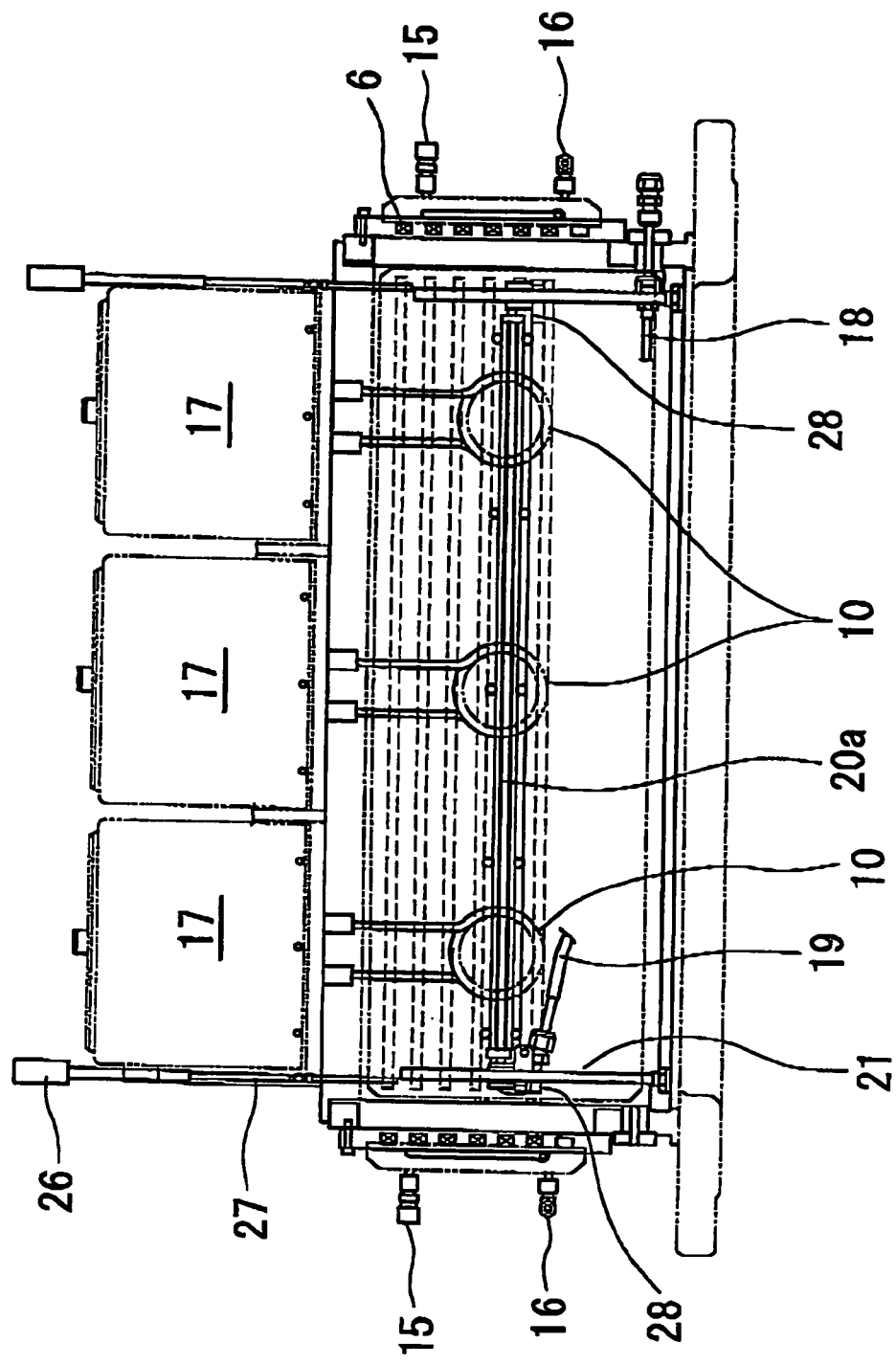
FIG. 4 is a block diagram of partially sectional view showing arrangement of the antenna element in the plasma chamber of the ion source apparatus according to the present invention.
Figure 5:
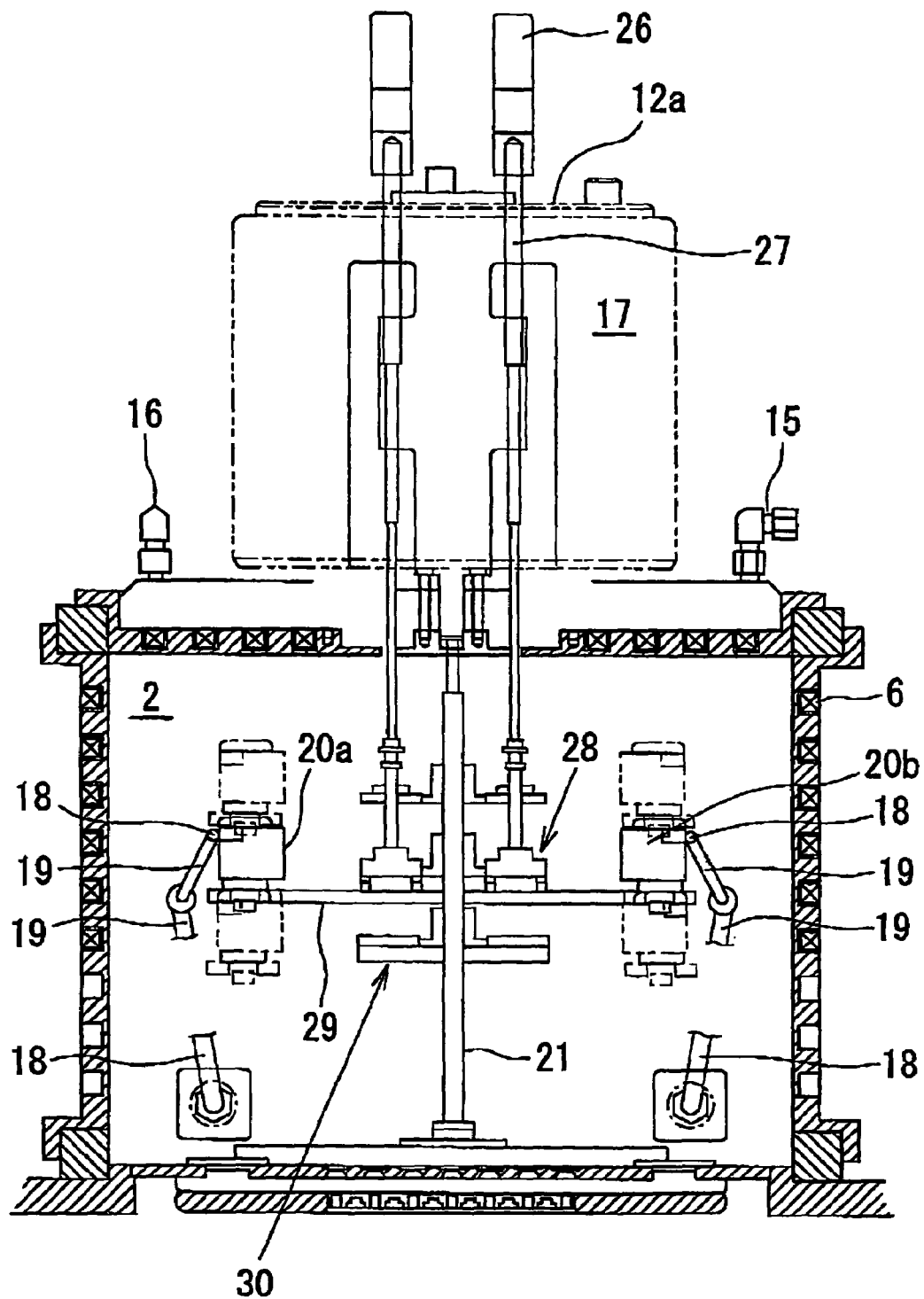
FIG. 5 is a block diagram of sectional view showing a structure of an adjuster horizontally and vertically displacing the antenna-opposed magnets according to the present invention.

Furthermore, the plasma chamber 2 is provided with condenser tubes (not shown) circulating coolant around the surface of the walls thereof through a supply port 15 and an exhaust port 16 arranged at the top wall 5 and the side walls 7. And also, as shown in FIG. 4, another condenser tubes 18 are provided at the side walls of the plasma chamber 2, extending longitudinally from one end side thereof to the other end side, so as to flow coolant at the side surfaces of antenna-opposed magnets 20a and 20b (hereinafter antenna-opposed magnets 20). Flexible links 19 connect with one end side of the condenser tubes 18 thereby making the antenna-opposed magnets 20 movable without any restraint to an antenna element 10.

The extraction electrode system 3 is composed of a plasma electrode 11, an extraction electrode 12, a suppression electrode 13 and a ground electrode 14 in alignment as shown in FIG. 1. Each electrodes has the plurality of openings, thus ion beams can be extracted from the plasma chamber 2 through actions of electric fields with given voltages.

The present invention will be explained in more detail based on FIGS. 2–5. First, the present invention has the plasma chamber, including: the antenna element 10 extended from an antenna introduction opening of the top wall 5; a pair of antenna-opposed magnets 20 elongated in its shape sandwiching the antenna element 10; and an adjusting means (see FIG. 5) 30 horizontally and vertically movable such that the magnets 20 get closer to or away from the antenna element 10.

In FIG. 4, three pieces of antenna elements 10 are evenly arranged in the plasma chamber 2 provided with the permanent magnets 6 around the side walls 7 of the plasma chamber 2. Each antenna element 10 constituted of a coil with turn 2 connects with each corresponding high-frequency power 17. Thus, the antenna elements 10 are supplied with given high-frequency power. Here, although the antenna elements 10 are fixed by hanging from the top wall 5 and place in a center portion of the plasma chamber 2, it may be constructed as that the antennal elements 10 move in a vertical direction.

The antenna-opposed magnets 20 are composed of a pair of rod-like permanent magnets (20a and 20b) arranged in parallel at the side walls of the plasma chamber 2. Moreover, the antenna-opposed magnets 20 are arranged at the front and rear sides of the antenna element 10 in such a manner as to sandwich the antenna element 10. FIG. 4 only shows the permanent magnet 20a at the rear side.

Figure 6:
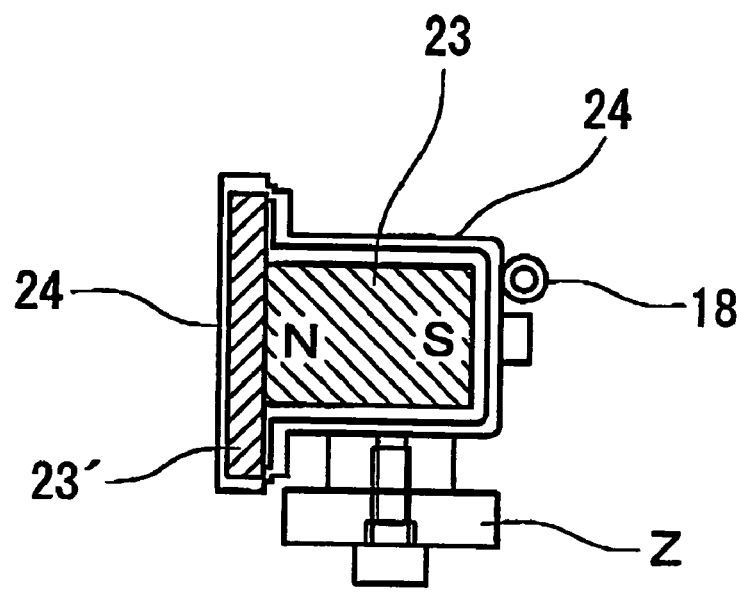
FIG. 6 is a diagram of sectional view showing a structure of magnet composed of a single core portion according to the antenna-opposed magnets of the present invention.

As shown in FIG. 6, each of the antenna-opposed magnets 20 is composed of a permanent magnet 23 and a yoke 23', and two shield cases 24 made of stainless steel completely cover the external of the permanent magnet 23 and the yoke 23'. The antenna-opposed magnet 20 is installed through an adjusting means 30 supported by posts 21 each located at central bilateral-ends of the plasma chamber 22. See FIG. 4 and FIG. 5. Further, in order to cool the antenna-opposed magnets 20, the condenser tubes 18 are provided all over surfaces of the shield cases 24.

The antenna-opposed magnets 20 are fixed to a horizontal plate 29 of the adjusting means 30 by means of a fastener such as bolts, screws, etc. In this structure, a horizontal distance between the antenna-opposed magnets 20 and the antenna element 10 can be adjusted. Here, a pair of the permanent magnets has been applied to the antenna-opposed magnet 20, but this is not limited thereto. That is, a pair of the permanent magnets can be applied to each of the antenna element 10, or the magnets can be applied to only one side of the antenna element 10.

The adjusting means 30 has a supporting device 28 vertically elevated through a revolving shaft 27 connected to a shaft of a drive motor 26 mounted on a housing top surface 12a of a high-frequency power 17. See FIG. 5. This supporting device 28 has the horizontal plate 29 extending in a lateral direction, and as described, the antenna-opposed magnets 20 are installed at both ends of the horizontal plate 29. In this structure, the antenna-opposed magnets 20 are made vertically close to or separate from the antenna element 10 in such a manner that the supporting device 28 is vertically moved through the adjusting means 30. Moreover, by mounting the antenna-opposed magnets 20 at arbitrary places on the horizontal plate 29, a relative distance between the magnets 20a and 20b can be adjusted making horizontal adjustment to the antenna element 10 possible.

Positional relation between the antenna-opposed magnets 20 and the antenna element 10 has been studied. As a result, it is found that the distance between the magnets 20a and 20b sandwiching the antenna element 10 will influence to a regional size of high-concentrated electrons. Specifically, when the antenna-opposed magnets 20 are placed right between the wall surface of the plasma chamber 2 and the antenna element 10, optimized electron energies have been obtained.

Still further, the plurality of the permanent magnets 6 circumferentially arranged at the wall surface of the plasma chamber 2 forming cusped magnetic fields should preferably not be placed at the wall surface of the plasma chamber 2 close to the most-front-row of the extraction electrode system 3. According to FIG. 2, the plasma chamber 2 can be imaginarily divided at a dotted line (a horizontal surface) P where a tip of the antenna element 10 is positioned, forming a region S having more numbers of the permanent magnets 6 and a region T having less numbers of the permanent magnets 6. In this structure, a region where electrons generate in the most effective manner can be created.

Further, each of the antenna-opposed magnets 20 is arranged in the metallic shield cases 24 surrounding the yoke portion of at least one row of the permanent magnet 6. In addition, since the shield cases 24 are provided with cooling ducts refrigerating heat from plasma, physical properties of the antenna-opposed magnets 20 can be maximized.

In the above-structured ion source apparatus 1, behaviors of ionized electrons generating from the antenna element 10 will be explained hereinbelow.

Figure 7B:
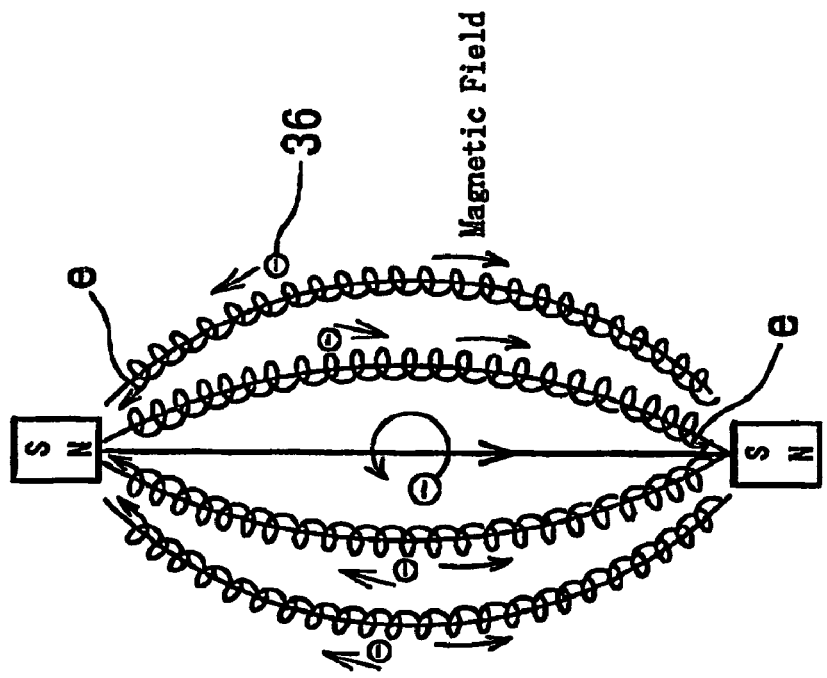
FIG. 7B is a diagram explaining a condition that electrons are trapped by means of one pair of magnets.
Figure 7A:
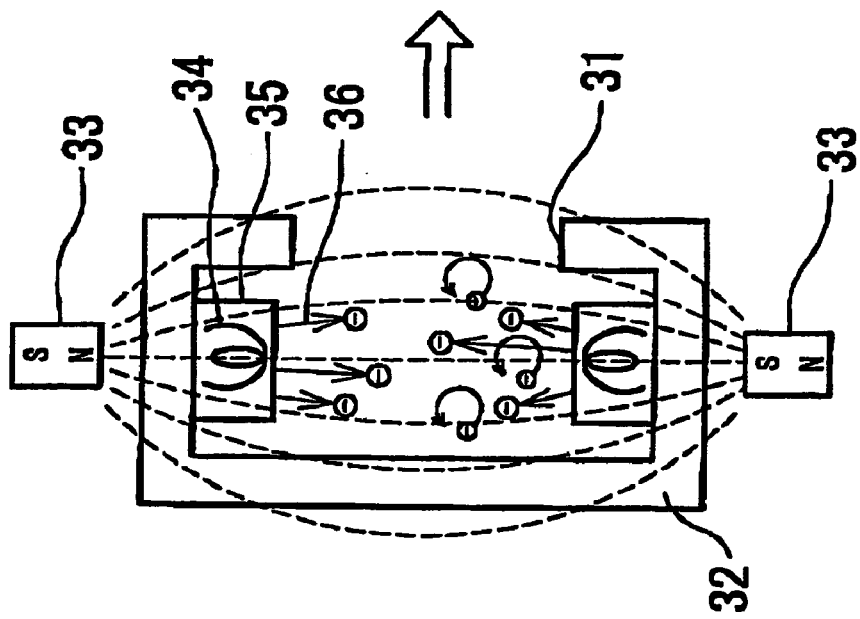
FIG. 7A is a diagram showing a burnous-typed ion source.
Figure 7C:
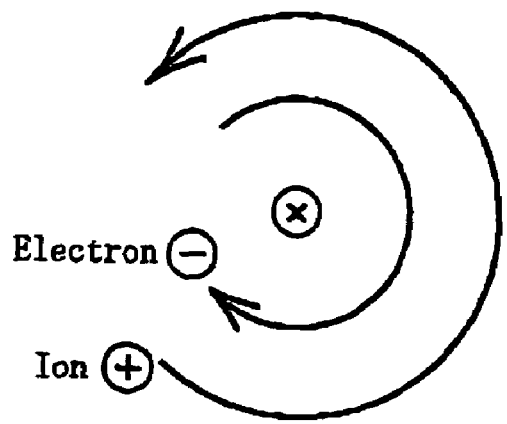
FIG. 7C is a diagram showing a cyclotron motion of electrons and ions in an advancing direction of a magnetic flux.
Figure 7D:
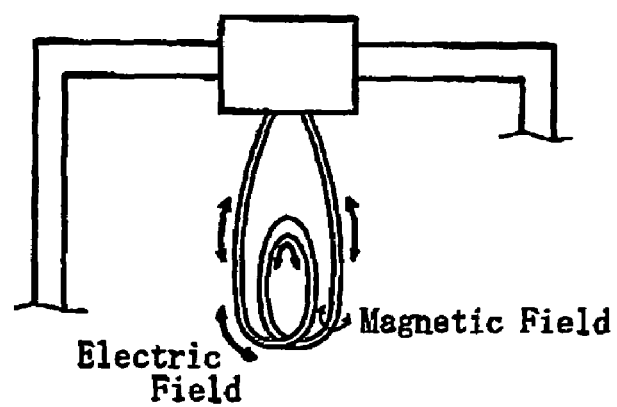
FIG. 7D is a diagram showing electric fields and magnetic fields giving influences on the antenna element.

While applying high-frequency voltages from the high-frequency power 17 to the antenna element 20, electric fields will be generated through electric current flowing to antenna while magnetic fields in an orthogonal direction to the electric fields will be acted (see FIG. 7D). The electric fields positively act on electrons whereas the magnetic fields have much less actions on the electrons. Further, when discharge plasma is generated in the plasma chamber 2 through high-frequency voltages, the discharge plasma is confined in the plasma chamber 2 by means of cusped magnetic fields formed by magnets. However, only weak magnetic fields are generally obtainable in the center of the plasma chamber 2 with the cusped magnetic fields formed by the permanent magnets 6 circumferentially provided at the side walls of the plasma chamber 2. As a result, only low-density plasma will be generated in the center of the plasma chamber 2, thus, magnetic fields generating electrons in energy range where objective ions are likely to produce cannot be strengthened.

Accordingly, in the present invention, the antenna element 10 is arranged in the center of the plasma chamber 2 while at least one pair of antenna-opposed magnets 20 is arranged nearby the antenna element 10. Through high-frequency electric fields by the antenna element 10 and magnetic fluxes by the antenna-opposed magnets 20 overpassing the electric fields, plasma density in the center of the plasma chamber 2 will be thickened. This construction will be described hereinbelow.

When plasma overpasses a pair of antenna-opposed magnets 20 sandwiching the antenna element 10, electrons in plasma are trapped by the magnetic fluxes because Larmor radius in the magnetic fields is small. Accordingly, by properly adjusting strength of the magnetic fields overpassing the antenna element 10, a region where density of electrons is thick can be formed around the antenna element 10. In the region, for example, diborane gas ($B_2H_6$) of ion source gas is dissociated through electrons into $B_2H_x^+$ or $BH_y^+$ ion, $H_x^+$ ion, etc. Thus, more numbers of objective ions generating ion beams can be produced in the high-density region of electrons. More specifically, while electrons are trapped and moved in the region, energies thereof have been lost. And, under ionized energies of H but over ionized energies of diborane, diborane ions will be increased. Based on the above, in the region around the antenna, plasma having electron energy distribution where diborane molecules are properly excited is produced.

Figure 3:
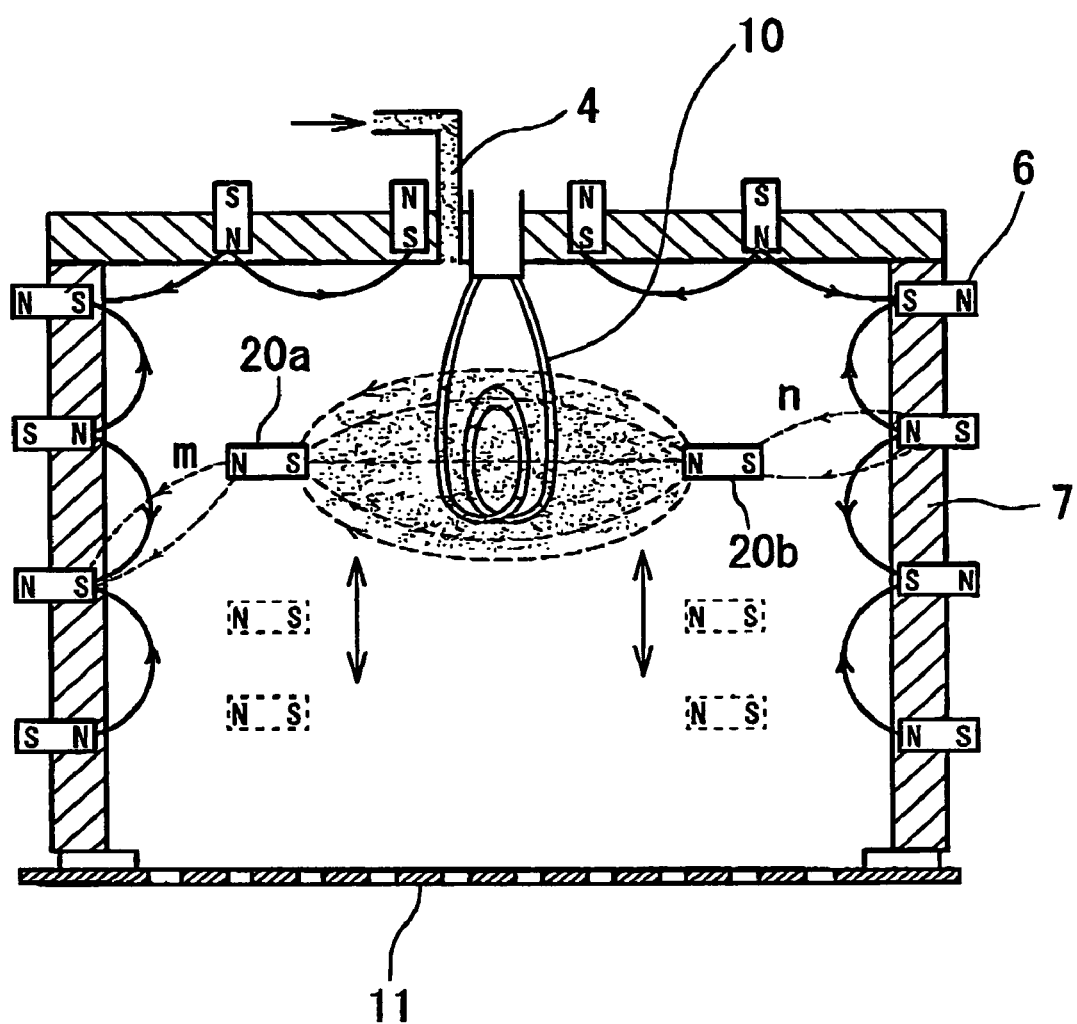
FIG. 3 is a diagram explaining a condition of magnetic fields in the plasma chamber according to the present invention.

In addition to the above, in cusped magnetic fields as shown in FIG. 3, the antenna-opposed magnets 20 make magnetic fields with nearby permanent magnets 6 arranged at the wall surface of the plasma chamber 2. Here, magnetic fluxes m and n are formed in a direction from N pole of one magnet to S pole of another magnet thus forming magnetic filters. As a result, not only by the magnetic filters formed between the antenna-opposed magnets 20 but also by the magnetic filters formed between the antenna-opposed magnets 20 and the permanent magnets 6 nearby arranged at wall surface of the plasma chamber 2, light ions of electrons or hydrogen ions, etc. can be trapped. On the other hand, heavy ions necessary for producing ion beams can pass through the magnetic filters in the plasma chamber 2 whereby strong ion beams can be extracted by means of the extraction electrode system.

Finally, the present invention is by no means limited to the specific embodiments described above but encompasses any possible changes and modifications capable within disclosure.

What is claimed is:

1. An ion source apparatus, comprising:
   a plasma chamber having a supply port for ion source gases;
   an antenna element for generating plasma in the plasma chamber through a high-frequency voltage supplied from high-frequency power;
   a plurality of magnetic elements peripherally arranged on wall surfaces of the plasma chamber and forming a cusped magnetic field confining the plasma;
   an extraction electrode system comprising a plurality of electrodes for extracting ion beams from the plasma;
   at least one pair of antenna-opposed magnets within the plasma chamber in a region bounded by the cusped magnetic field on opposite sides of the antenna element and relatively moveable in both horizontal and vertical directions to the magnetic elements and the antenna element; and
   a supporting device to perform a positional adjustment of the antenna-opposed magnets to the antenna element in the plasma chamber so as to form a high-concentrated area for generating electrons around the antenna element through electric fields based on outputs of the antenna element and magnetic fields of the antenna-opposed magnets crossing the antenna element.

2. The ion source apparatus according to claim 1, wherein the supporting device adjusts at least one of the following: a distance between the antenna-opposed magnets; and a distance between the antenna-opposed magnets and an electrode of the most-front-row in the extraction electrode system.

3. The ion source apparatus according to claims 1, wherein the antenna-opposed magnets are composed of a pair of permanent magnets on opposite sides of the antenna element.

4. The ion source apparatus according to claim 3, wherein the antenna-opposed magnets are placed approximately in the center of the wall surfaces of the plasma chamber and the antenna element.

5. The ion source according to claim 1, wherein a plurality of the magnetic elements circumferentially arranged at the wall surfaces of the plasma chamber forming the cusped magnetic field are not placed at the wall surfaces of the plasma chamber nearby an electrode of the most-front-row in the extraction electrode system.

6. The ion source apparatus according to claim 5, wherein the plasma chamber is divided into an upper region having large numbers of the magnetic elements and a lower region having less numbers of the magnetic elements at an imaginary horizontal surface created where a tip of the antenna element extending in the plasma chamber is positioned.

7. The ion source apparatus according to any one of claims 1, wherein the antenna-opposed magnets are arranged in a metallic shield case where a yoke portion of at least one row of a permanent magnet is covered.

8. The ion apparatus according to claim 7, wherein the metallic shield case is provided with a cooling duct refrigerating heat received from the plasma.

9. An electronic energy optimized method in an ion source apparatus for improving a generation rate of desired ions, comprising the steps of:

arranging magnetic elements at walls of a plasma chamber thus forming a cusped magnetic field;

supplying an ion source gas into the plasma chamber;

generating plasma with electrons by applying a high-frequency voltage to an antenna element provided in the plasma chamber;

extracting ion beams from the plasma through action of electric fields by means of an extraction electrode system constituted of a plurality of electrodes;

positioning antenna-opposed magnets nearby the antenna element in the plasma chamber; and adjusting a relative position of the antenna-opposed magnets to the antenna element to form a high-concentrated region generating electrons which traps electrons around the antenna element through electric fields based on outputs of the antenna element and magnetic fields of the antenna-opposed magnets crossing the antenna element.

10. The electronic energy optimized method according to claim 9, including the steps of:

ionizing the ion source gas through electrons generated in the high-concentrated regions; and producing two magnetic actions, magnetic fields generated through the antenna-opposed magnets, and magnetic fields generated between the magnetic elements provided at walls of the plasma chamber and the antenna-opposed magnets.

11. The electronic energy optimized method according to claim 9, wherein the antenna-opposed magnets are composed of a pair of permanent magnets sandwiching the antenna element, and the antenna-opposed magnets are placed approximately in the center of the wall surfaces of the plasma chamber and the antenna element.

* * * * *